United States Patent [19]

Furuyama et al.

[11] Patent Number: 4,810,670
[45] Date of Patent: Mar. 7, 1989

[54] METHOD OF MANUFACTURING AN EMBEDDED TYPE SEMICONDUCTOR LASER

[75] Inventors: Hideto Furuyama, Oota; Atsushi Kurobe, Kawasaki, both of Japan

[73] Assignee: Kabushiki Kaisha Toshiba, Kanagawa, Japan

[21] Appl. No.: 943,760

[22] Filed: Dec. 19, 1986

[30] Foreign Application Priority Data

Mar. 6, 1986 [JP] Japan .................. 61-47334

[51] Int. Cl.$^4$ .............. H01L 7/38; H01L 21/203
[52] U.S. Cl. ................................ 437/129; 437/130; 437/156
[58] Field of Search .............. 437/129, 130, 156; 372/47

[56] References Cited

U.S. PATENT DOCUMENTS

| | | | |
|---|---|---|---|
| 3,984,262 | 10/1976 | Burnham et al. | 437/129 |
| 4,251,298 | 2/1981 | Thompson | 437/129 X |
| 4,716,125 | 12/1987 | Makiuchi | 437/129 X |

FOREIGN PATENT DOCUMENTS

51-147985 12/1976 Japan .
57-89286 6/1982 Japan .

OTHER PUBLICATIONS

"Disorder of an AlAs-GaAs Superlattice by Impurity Diffusion" W. D. Laidig et al., Appl. Phys. Lett. 38(10), May 15, 1981, pp. 776-778.

"Stripe-Geometry AlGaAs-GaAs Quantum-Well Heterostructure Lasers Defined by Impurity-Induced Layer Disordering", K. Meehan et al., APL 44(7), Apr. 1, 1984, pp. 700 and 701.

Gavrilovic et al., "Si-Implanted and Disordered Stripe-Geometry $Al_xGa_{1-x}As$-GaAs Quantum Well Lasers" Appl. Phys. Lett. 47(9), Nov. 1, 1985, pp. 903-905.

van Oirschot et al., "Ridged Substrate Internally Diffused Stripe . . . " Nov. 1, 1983, pp. 809-811, Applied Physics Letters.

K. Uomi et al., "High-Power Operation of Index-Guided Visible . . . " Oct. 15, 1984, pp. 818-820, Applied Physics Letters.

T. Hayakawa et al., "Temperature Dependence of Threshold Current . . . " Nov. 1981, pp. 2205-2210, IEEE Journal of Quantum Electronics.

Primary Examiner—Brian E. Hearn
Assistant Examiner—Tom Thomas
Attorney, Agent, or Firm—Foley & Lardner, Schwartz, Jeffery, Schwaab, Mack, Blumenthal & Evans

[57] ABSTRACT

In an embedded type semiconductor laser, at least three layers of a first conduction type clad layer, a quantum well active layer which contains a first or second conduction type or a pn junction, and a second conduction type clad layer, are grown successively on a first conduction type substrate. A high concentration impurity doped layer is provided excluding a predetermined striped region, situated adjacent to the active layer. An impurity diffusion is carried out by heat treatment which diffuses dopant from the high concentration impurity doped layer to the active layer.

8 Claims, 5 Drawing Sheets (a)

(b)

(c)

(d)

(a)

(b)

(c)

METHOD OF MANUFACTURING AN EMBEDDED TYPE SEMICONDUCTOR LASER

BACKGROUND OF THE INVENTION

1. Field of the Invention

The present invention relates to an embedded type semiconductor laser which can be manufactured by selective diffusion, and a method for manufacturing the same.

2. Description of the Prior Art

A semiconductor laser is being applied to the fields of optical communications and optical information processing as a small-size and light-weighted light emitting source.

For a semiconductor laser, mode control of the guided light is necessary, and in particular, control of the transverse modes is important. Various kinds of laser structure have been proposed so far for controlling the transverse modes of the semiconductor laser. Among these it has been found that the embedded type semiconductor laser is essentially effective.

As to the method of manufacturing embedded type semiconductor lasers, proposed structures may be classified roughly into the following three categories. The first is a method in which crystal growth that includes an active layer, and mesa etching that excludes a required width of the active layer, are carried out first, followed by an embedded crystal growth on the side etched surfaces of the mesa. The second is a method in which formation of grooves and ridges on the semiconductor is carried out, and then a selective crystal growth is carried out so as to embed the active layer by the groove and ridge portions that are formed. The third is a method in which crystal growth which contains an active layer is carried out first, and then impurity diffusion is carried out leaving a required width of the active layer to lower the refractive index of the side surfaces. In the third method, and in particular when the active layer is so thin as to form a quantum well, the effect of interdiffusion of atoms at hetero-interface due to impurity diffusion becomes conspicuous, so that it becomes possible to cause a selective modification of the composition.

A comparison of the above three methods shows that in the first method, the thickness of the active layer, the embedding width, and the refractive index of the embedded crystal (crystal composition) can be selected independently, so that the degree of freedom in device design is high. However, in the second crystal growth for embedding, the side surfaces of the active layer are exposed directly to the high temperature gas so that the quality of the crystal interface tends to be deteriorated. There also remains thermal distortion due to crystal re-growth.

In the second method, although problems such as those appear in the first method can be resolved, the controllability of the film thickness and the width of the active layer is low due to the use of singular crystal growth in the groove and the ridge portions. In the third method, crystal growth is essentially only for once, and the crystal growth for embedding for the second time is unnecessary in principle. However, it has a drawback such as the difficulty in the impurity diffusion for embedding.

The present method relates to an improvement of the third method. In the third method, drawbacks such as those exist in the first and the second methods are nearly eliminated, but there is a drawback in that it has a difficulty in manufacturing, as mentioned above. In what follows, the prior art of the third method will be described. In so doing, reference will be made to a mixed crystal system of $Al_xGa_{1-x}As$ as an example.

In FIG. 1 is shown an example of impurity diffusion type embedded semiconductor due to the prior art. Reference numeral 501 is a GaAs substrate, 502 is an $Al_xGa_{1-x}As$ cladding layer, and 503 is a quantum well active layer due to $Al_yGa_{1-y}As/Al_zGa_{1-z}As$ which is a multi-quantum well in this example. Reference numeral 504 is an $Al_xGa_{1-x}As$ cladding layer, 505 is a GaAs ohmic contact layer, and 506 is an impurity diffusion region where Zn, Si, S, and others are used as impurity. Reference numerals 507 and 508 are electrode metals. The region where 503 and 506 overlap is the region where the quantum well structure is disordered due to impurity diffusion, the so-called disordered region. In the disordered region, it is possible to lower the index of refraction compared with the region which is not disordered so that it is possible to form an embedded wave guide. Problems in such prior art are the formation method and the profile control of the impurity diffusion region 506. Namely, in the prior art as shown in FIG. 1, impurity diffusion in vapor phase is carried out by providing a stripe-formed selective diffusion mask. In doing so, it is necessary to precisely control the partial pressure of diffused impurity for controlling the diffusion depth, and to control the temperature and the like. In addition, in the prior art of FIG. 1, a diffusion depth of greater than 2 [μm] is necessary and a sufficient consideration on the diffusion profile is necessary. That is, it is due to this circumstance that the diffusion profile form tails as shown in FIG. 1 so that the variations in the diffusion depth to the variations in the width of the active layer to be embedded becomes large. In the prior art, considerations to prevent the influence due to the diffusion profile were not given.

As in the above, in the prior art there were problems in the areas of controllability and reproducibility of the width of the active layer with respect to the diffusion depth in the manufacturing process.

SUMMARY OF THE INVENTION

An object of the present invention is to provide an embedded type semiconductor laser, and a method for manufacturing the same, which can overcome the drawbacks in the prior art, to improve the reproducibility in manufacturing, of the width of the active layer with respect to the diffusion depth, and also to improve the performance of the semiconductor elements.

To achieve the above object, the semiconductor laser of the present invention, and the method for manufacturing the same, are characterized in that there are successively grown at least three layers on a substrate of a first conduction type: a cladding layer of the first conduction type, an active layer of quantum well that contains the first or second conduction type or p-n junction, and a cladding layer of the second conduction type, there is provided adjacent to the active layer a high concentration impurity doped layer that excludes a prescribed striped region, and an impurity diffusion is performed by heat treatment which extends from the high concentration impurity doping layer up to the active layer.

In addition, the present invention is characterized in that it provides a current blocking comprising reverse biased layers or high resistance layers on the upper or lower side of the high concentration impurity doped layer.

BRIEF DESCRIPTION OF THE DRAWINGS

These and other objects, features and advantages of the present invention will be more apparent from the following description of the preferred embodiments taken in conjunction with the accompanying drawings in which.

DESCRIPTION OF THE PREFERRED EMBODIMENTS

Next, an embedded type semiconductor laser of the present invention, and its method of manufacture, will be described in detail using the $Al_xGa_{1-x}As$ mixed crystal system as an example. The present invention can be especially applied to a laser diode of the embedded type semiconductor laser.

Figure 1:
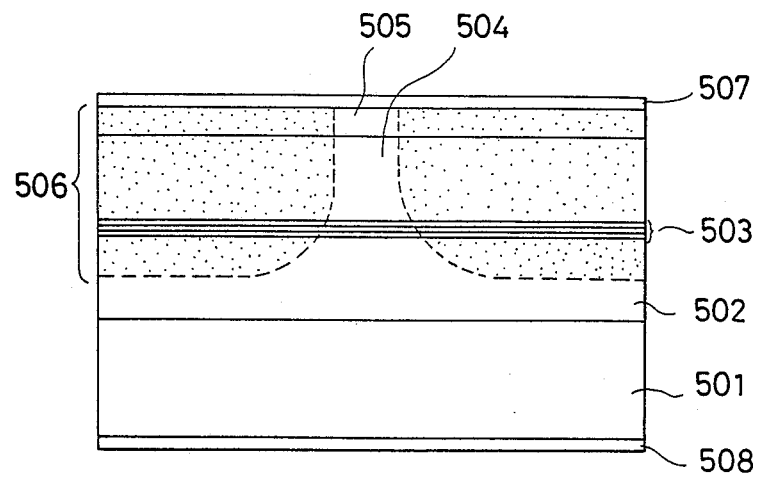
FIG. 1 is a cross sectional view which shows the construction of the prior-art embedded type semiconductor laser.
Figure 2:
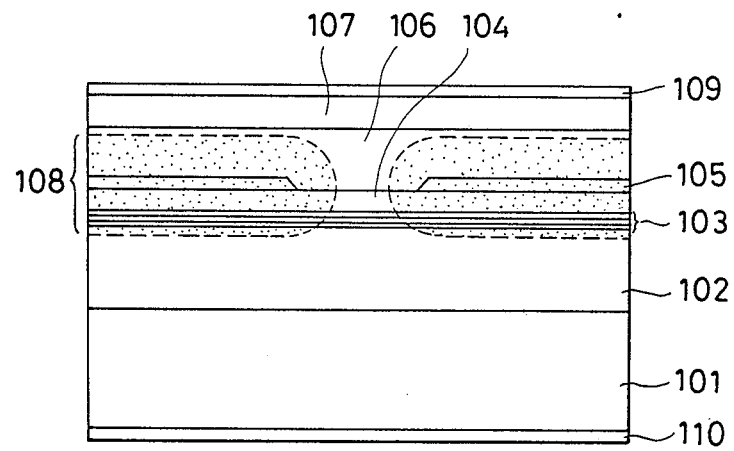
FIG. 2 is a cross sectional view of the construction of an embodiment of the present invention.

In FIG. 2, 101 is an n-type GaAs substrate, 102 is an n-type $Al_{0.48}Ga_{0.52}As$ cladding layer, 103 is a multiple quantum well active layer formed by growing a plurality of $Al_{0.22}Ga0.78As$ barrier layer and GaAs quantum well layer, 104 is a p-type $Al_{0.48}Ga_{0.52}As$ cladding layer, 105 is a p-type GaAs high concentration impurity doped layer, 106 is a p-type $Al_{0.48}Ga_{0.52}As$ cladding layer, 107 is a p-type GaAs ohmic contact layer, 108 is an impurity diffused region, and 109 and 110 are electrode metals. Here, the constructions of each of the layers 102 to 108 are as follows. The cladding layer 102 is an active layer with thickness of about 2 $\mu$m, 103 is of n-type, p-type, or i-type which is formed by growing 1 to 10 layers of, for instance, barrier layer of 150 Å and quantum well layer of 80 Å, the cladding layer 104 has a thickness of 0.3 $\mu$m where the impurity is Mg and the concentration is $5 \times 10^{17}$ cm$^{-3}$, the high concentration impurity doped layer 105 has Zn as impurity, a concentration of $1 \times 10^{19}$ cm$^{-3}$ and a thickness of 0.3 $\mu$m, the cladding layer 106 has a thickness of about 1.5 $\mu$m where the impurity is Mg and the concentration is $5 \times 10^{17}$ cm$^{-3}$, and the ohmic contact layer 107 has a thickness of 0.5 $\mu$m. Further, the impurity diffused region 108 is the region of about 0.6 $\mu$m from the high concentration impurity doped layer 105 to the lower edge.

Figure 3:
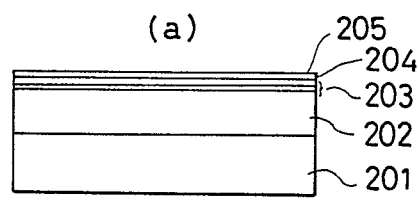
FIG. 3 is a cross sectional view which shows the manufacturing processes of the embedded type semiconductor laser in accordance with a first embodiment of the present invention.
Figure 3:
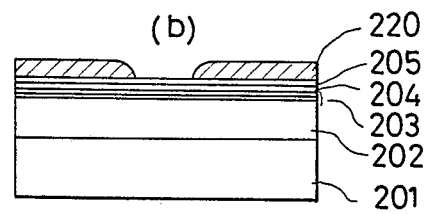
Figure 3:
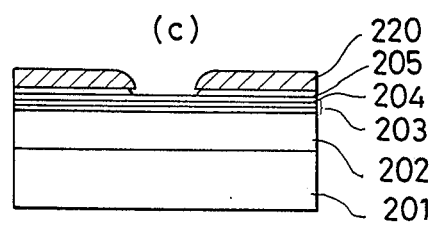
Figure 3:
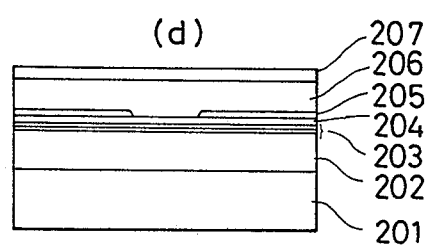

In FIG. 3 is shown the manufacturing processes of the embedded type semiconductor layer of the present invention for realizing the structure shown in FIG. 2. First, in FIG. 2(a), crystal growth on the n-type GaAs substrate 201 is carried out to form an n-type cladding layer 202, a quantum well active layer 203, a p-type cladding layer 204, and a high concentration impurity doped layer 205. As the crystal growth method use may be made, for example, of the MO-CVD (Metal Organic Chemical Vapor Deposition) method at a growth temperature of 775° C. In FIG. 2(b), a photoresist mask 220 for selectively removing the high concentration impurity doped layer 205 is formed. As the photoresist, for example, cyclorubber-based resist may be used. Further, the width of the photoresist window may be set by considering the distance of impurity diffusion and the width of the embedded active layer, which was set to 2.5 $\mu$m in this example. FIG. 2(c) shows the process of selective removal of the high concentration impurity doped region 205. The selective removal may be done, for instance, by chemical etching by the use of a mixed solution NH$_4$OH:H$_2$O$_2$=1:20 (volume ratio) for about 5 seconds. In FIG. 2(d), crystal growth for the p-type cladding layer 206 for light confinement and the ohmic contact layer 207 is carried out, for instance, by the MO-CVD method at the temperature of 750° C. After that, a heat treatment is given for diffusing the impurity using the high concentration impurity doped region 205 as a source layer. The heat treatment may be carried out for about 100 minutes at 800° C. In particular, the heat treatment for impurity diffusion may be carried out by simply holding the crystal at high temperature in the crystal growth furnace, after growing the crystal.

Figure 4:
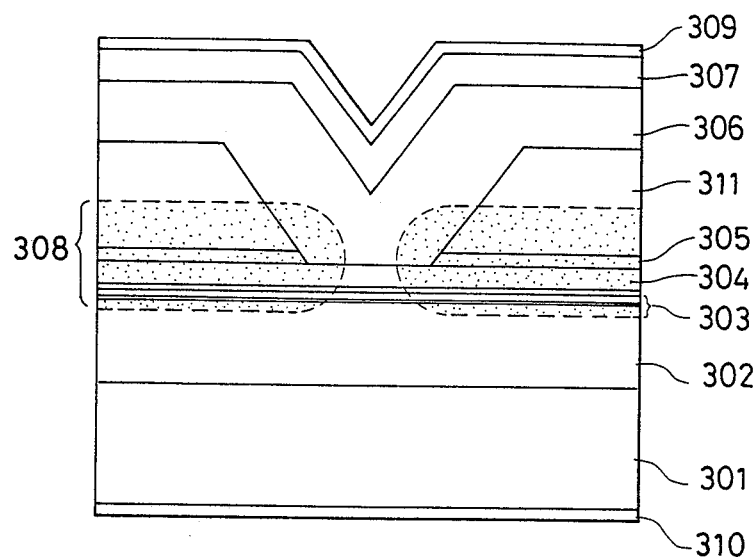
FIG. 4 and FIG. 5 are the cross sectional views of the construction due to second and third embodiments.

In FIG. 4 is shown a cross sectional view of the second embodiment of the configuration of the embedded semiconductor laser due to the present invention whose layers essentially correspond to those shown in FIG. 3. This embodiment corresponds to providing an $Al_{0.48}Ga_{0.52}As$ current blocking layer 311 of n-type or i-type on 105 of FIG. 2. Formation of 311 can be achieved analogously to the processes of FIG. 3 by providing in advance an n-type or i-type $Al_{0.48}Ga_{0.52}As$ layer on the layer 205 of FIG. 3(a). The thickness of the current blocking layer 311 may be set at 1.5 to 2.0 $\mu$m. Further, etching in the process corresponding to FIG. 3(c) may be modified to an etching for about 40 seconds with an etching solution of KI:I$_2$:H$_2$O=113:65:100,000 (ratio in weight), followed by a second etching for about 5 seconds with the etching solution NH$_4$OH:H$_2$O$_2$=1:20 (ratio in volume) mentioned earlier.

According to the embodiment of FIG. 4, the current through the current blocking layer 311 of the n-type or i-type to the impurity diffusion region 308 is suppressed.

Consequently, the semiconductor laser of the present embodiment is effective in obtaining an element with satisfactory emission efficiency, by suppressing the leakage current that flows in the regions other than the required active region by the reverse biased junction of the n-type current blocking layer and the p-type impurity diffusion region 308 or by a high resistance region of the i-type.

Figure 5:
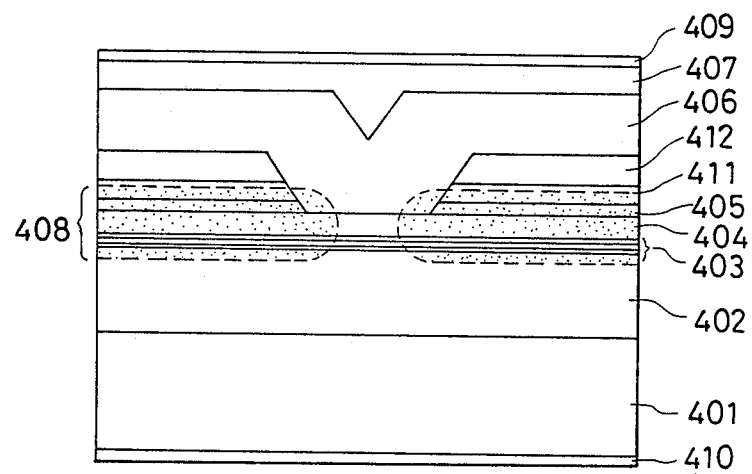

In FIG. 5 is shown an improvement over the embodiment shown in FIG. 4. In FIG. 5, the current blocking layer 311 shown in FIG. 4 is replaced by a two-layered structure of an n-type or i-type GaAs layer 411 and an n-type or i-type $Al_{0.48}Ga_{0.52}As$ layer 412. This is to cause impurity diffusion with diffusion distance which is asymmetric with respect to the up and down directions, by using a characteristic that the impurity diffusion constant in GaAs is smaller than the diffusion constant in AlGaAs. Because of this, the thickness of the current blocking layers 411 and 412 can be made smaller than in the case of FIG. 4, which improves the flatness of the re-grown surface and reduces the internal strain. This enhances the reliability of the device. The layers 411 and 412 are given a thickness of about 0.3 μm for 411 and 0.5 μm for 412, respectively. Further, the manufacturing process can be realized by partially modifying the process of FIG. 3, analogous to the case of FIG. 4. Here, it only needs to modify the process that corresponds to FIG. 3(c) to the etching with the solutions $KI:I_2:H_2O$ and $NH_4OH:H_2O_2$ that were explained in connection with FIG. 4, for the durations of about 6 seconds and about 10 seconds, respectively.

In the present invention, the impurity diffusion is carried out by the solid phase diffusion using highly doped layer as a diffusion source, so that it has a more satisfactory stability of the concentration of the diffusion source, compared with the case of performing diffusion from the external vapor phase which is done in the prior art. In addition, the diffusion distance can be made smaller than 1 μm so that the controllability is also enhanced compared with the existing case of diffusion for a distance of more than 2 μm. Further, the high concentration impurity doped layer needs only be situated at a distance from the active layer, instead of being adjacent to it, as long as it is located at a distance that can supply a necessary impurity concentration, by the heat treatment of the impurity doped layer which is to give a prescribed amount of diffusion. The distance is to be determined by considering the controllability of the heat treatment.

Accordingly, it is possible by the present invention to improve the controllability of the impurity diffusion, and to obtain an embedded type semiconductor laser that has a high reproducibility.

Figure 6:
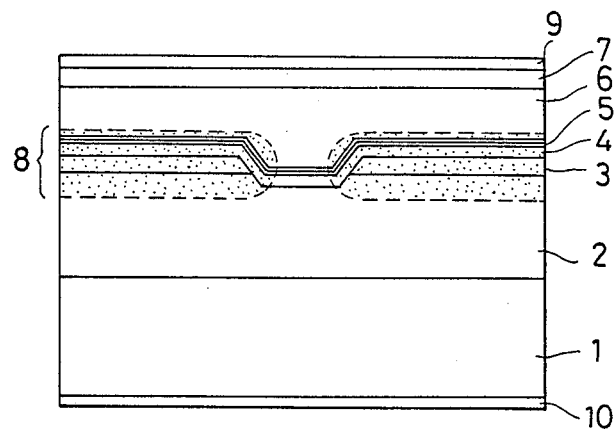
FIG. 6 is a cross sectional view of the construction of the embedded type semiconductor laser due to a fourth embodiment of the present invention.

In FIG. 6 is shown a cross sectional view of the embedded type semiconductor due to a fourth embodiment of the present invention. In the figure, 1 is an n-type GaAs substrate, 2 is an n-type $Al_{0.48}Ga_{0.52}As$ cladding layer, 3 is a p-type $Al_{0.65}Ga_{0.35}As$ high concentration impurity doped layer, 4 is an n-type $Al_{0.48}Ga_{0.52}As$ buffer layer, 5 is a quantum well active layer which consists of an $Al_{0.22}Ga_{0.78}As$ barrier layer and a GaAs quantum well layer, 6 is a p-type $Al_{0.48}Ga_{0.52}As$ cladding layer, 7 is a p-type GaAs ohmic contact layer, 8 is an impurity diffused region, and 9 and 10 are electrode metals. In this embodiment, the high concentration impurity doped layer 3 is provided beneath the quantum well active layer 5. The composition of the layers 2 to 7 is as follows. The cladding layer 2 has a thickness of 2.5 to 3.0 μm, the high concentration impurity doped layer 3 has Zn as the impurity, a concentration of $1 \times 10^{19}$ $cm^{-3}$ and a thickness of 0.3 μm, the buffer layer 4 has a thickness of 0.2 μm. The active layer 5 is of n-type, p-type, or i-type and the thickness of barrier layer is 150 Å and that of well layer is 80 Å for example. The cladding layer 6 has a thickness of 1.5 μm where the impurity, is Mg and the concentration is $5 \times 10^{17}$ cm$^{-3}$, and the ohmic contact layer 7 has a thickness of 0.5 μm. The front of impurity diffused region 8 is about 0.6 μm from the high concentration impurity doped layer 3 in the direction of the top edge.

Figure 7:
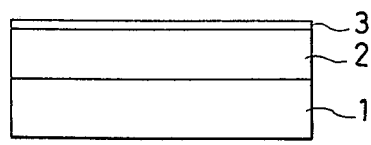
FIGS. 7(a), 7(b) and 7(c) are the cross sectionl diagrams which show the manufacturing processes of the embedded type semiconductor laser in accordance with the fourth embodiment of the present invention.
Figure 7:
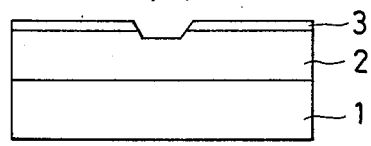
Figure 7:
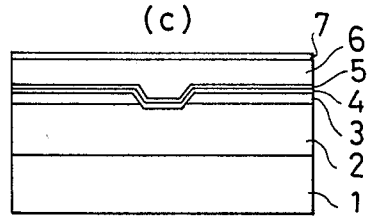

In FIG. 7 is shown the manufacturing process of the embedded type semiconductor laser due to the present invention for realizing the structure shown in FIG. 6. First, in FIG. 7(a), crystal growth on an n-type GaAs substrate 1 is carried out to form the n-type clad layer 2 and the high concentration impurity doped layer 3. For the crystal growth the MO-CVD method with the growth temperature of 750° C., for instance, may be adopted. In FIG. 7(b), grooves are formed for selectively removing the high concentration impurity doped layer. For this purpose, ordinary photolithography may be employed to carry out etching by a photoresist mask. As the photoresist for example, cyclorubber-based resist can be used. Further, the width of the photoresist window is to be set by considering the distance of the impurity diffusion and the width of the embedded active layer, which is chosen to be 2.5 μm here. The selective removal of the high concentration impurity doped layer 3 may be carried out, for example, by chemical etching with the use of a mixed solution of $H_2SO_4:H_2O_2$:-$H_2O=4:1:1$ (volume ratio) at 20° C. for about 25 seconds. FIG. 7(c) shows the crystal growth of the quantum well active layer. First, a buffer layer 4 for preventing the influence of the regrown surface on the active layer is formed, followed by crystal growth for the quantum well active layer 5, the p-type cladding layer 6, and the ohmic contact layer 7. The crystal growth may be done, for instance, by the MO-CVD method at 750° C. Then, a heat treatment is performed to diffuse impurity from the high concentration impurity doped layer 3. The heat treatment may be carried out for about 100 minutes at 800° C. In particular, the heat treatment for impurity diffusion can be done by simply holding the crystal in the crystal growth furnace after crystal formation in FIG. 7(c).

Figure 8:
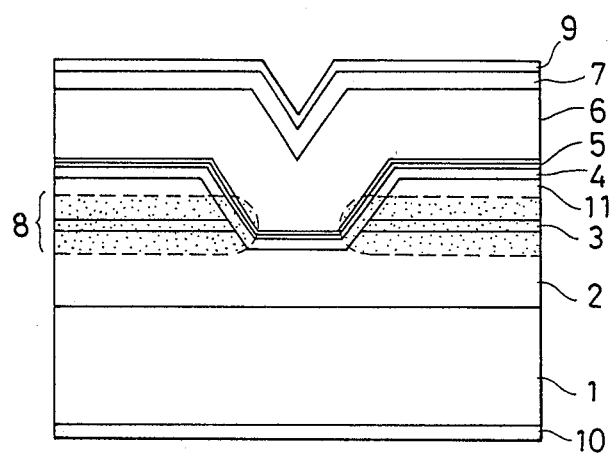
FIG. 8 is a cross sectional view of the embedded type semiconductor laser due to a fifth embodiment of the present invention.

In FIG. 8 is shown a cross sectional view of the construction of the embedded type semiconductor laser due to a fifth embodiment of the present invention. This embodiment corresponds to a provision of an n-type or i-type $Al_{0.48}Ga_{0.52}As$ current blocking layer 11 above the high concentration impurity doped layer 3 of FIG. 6. The formation of the layer 11 can be realized similar to the process of FIG. 7 by growing an n-type or i-type $Al_{0.48}Ga_{0.52}As$ layer above the layer 3 of FIG. 7(a). The thickness of the layer 11 may be 1.0 to 1.5 μm. Further, the etching in the process of FIG. 7(b) needs to be modified to an etching time of about 40 seconds with the etching solution of $KI:I_2H_2O=113:65:100,000$ (ratio in weight), followed by an etching for about 25 seconds at 20° C. by the use of an etching solution of $H_2SO_4:$-$H_2O_2:H_2O=4:1:1$ (ratio in volume).

The semiconductor laser according to the present embodiment can suppress the leakage current that flows in the area other than a required active layer region by a reverse biased junction or a high resistance region, so that it is effective for obtaining high efficient laser diodes.

The present invention is not limited to the above embodiments. Thus, for instance, the composition, construction, manufacturing conditions, and others can be changed timely. Further, for the embodiments of the present invention description has been made in conjunction with a mixed crystal system of $Al_xGa_{1-x}As$. However, the invention may be embodied by the use of a material such as $Ga_xIn_{1-x}As_yP_{1-y}$ mixed crystal system or $Al_xIn_{1-x}As_yP_{1-y}$ mixed crystal system. Moreover, the method of manufacture and others are not limited to those in the foregoing embodiments. For example, the method of crystal growth is not limited to the MO-CVD method, and it can be embodied by the Molecular Beam Epitaxy (MBE) method and the like. In addition, as the method of growing the high concentration impurity doped layer, the so-called atomic planar doping method in which doping is performed on a growth-interrupted surface, and similar methods may be used.

In summary, the present invention may be given various modifications without departing from the main purpose and the scope of the invention.

What is claimed is:

1. A method for manufacturing an embedded type semiconductor laser by growing at least three layers composed of a first conduction type cladding layer, a quantum well active layer containing a first or second conduction type or a p-n junction, and a second conduction type cladding layer, said method comprising the steps of:
   forming a high concentration impurity doped layer on a second conduction type buffer layer formed on the quantum well active layer by crystal growth;
   selectively removing the high concentration impurity doped layer and the striped region;
   performing crystal-growth of the second conduction type cladding layer on the high concentration impurity doped layer and the striped region; and
   performing an impurity diffusion by heat treatment from the high concentration impurity doped layer to the quantum well active layer, the temperature of the heat treatment being higher than that in the crystal growth.

2. The method for manufacturing an embedded type semiconductor laser as claimed in claim 1, further comprising the step of forming a current blocking layer on said high concentration impurity-doped layer.

3. The method for manufacturing an embedded type semiconductor laser as claimed in claim 1, wherein the heat treatment for impurity diffusion is carried out by holding at a temperature greater than 800° C.

4. The method for manufacturing an embedded type semiconductor laser as claimed in claim 2, wherein said current blocking layer comprises a first current blocking sub-layer and a second current blocking sub-layer which has an impurity diffusing constant smaller than the impurity diffusion constant of the first current blocking sub-layer.

5. A method for manufacturing an embedded type semiconductor laser by growing at least three layers composed of a first conduction type cladding layer, a quantum well active layer containing a first or second conduction type or a p-n junction, and a second conduction type cladding layer, said method comprising the steps of:
   forming a high concentration impurity doped layer on the first conduction type cladding layer by crystal growth;
   selectively removing the high concentration impurity doped layer to form a striped region;
   forming a first conduction type buffer layer on the high concentration impurity doped layer and the striped region;
   forming the quantum well active layer on said buffer layer by crystal growth;
   performing the crystal-growth of the second conduction type cladding layer on the quantum well active layer; and
   performing an impurity diffusion by heat treatment from the high concentration impurity doped layer to the quantum well active layer, the temperature of the heat treatment being higher than that in the crystal growth.

6. The method for manufacturing an embedded type semiconductor laser as claimed in claim 5, further comprising the step of forming a current blocking layer on said high concentration impurity-doped layer.

7. The method for manufacturing an embedded type semiconductor laser as claimed in claim 5, wherein the heat treatment for impurity diffusion is carried out by holding at a temperature greater than 800° C.

8. The method for manufacturing an embedded type semiconductor laser as claimed in claim 5, wherein said current blocking layer comprises a first current blocking sub-layer and a second current blocking sub-layer which has an impurity diffusion constant smaller than the impurity diffusion constant of the first current blocking sub-layer.

* * * * *